United States Patent
Lee et al.

(10) Patent No.: US 7,488,428 B2
(45) Date of Patent: Feb. 10, 2009

(54) METHOD FOR FORMING STACKED VIA-HOLES IN PRINTED CIRCUIT BOARDS

(75) Inventors: Wen-Chin Lee, Tayuan (TW); Cheng-Hsien Lin, Tayuan (TW)

(73) Assignee: Foxconn Advanced Technology Inc., Tayuan, Taoyuan (TW)

( * ) Notice: Subject to any disclaimer, the term of this patent is extended or adjusted under 35 U.S.C. 154(b) by 10 days.

(21) Appl. No.: 11/309,852

(22) Filed: Oct. 13, 2006

(65) Prior Publication Data

US 2007/0269588 A1    Nov. 22, 2007

(30) Foreign Application Priority Data

May 19, 2006   (TW) .............................. 95117893 A

(51) Int. Cl.
  *H01B 13/00*  (2006.01)
(52) U.S. Cl. .................. 216/17; 13/58; 13/65; 257/760
(58) Field of Classification Search .............. 216/17, 216/58, 65, 66, 13; 257/760, 762
See application file for complete search history.

(56) References Cited

U.S. PATENT DOCUMENTS

| 7,078,816 B2* | 7/2006 | Japp et al. .................. 257/762 |
| 2004/0043310 A1* | 3/2004 | Takeishi et al. ............... 430/22 |
| 2004/0178492 A1 | 9/2004 | Tsukamoto et al. |
| 2006/0191133 A1* | 8/2006 | Nakao et al. .................. 29/831 |

FOREIGN PATENT DOCUMENTS

| TW | 520630 | 2/2003 |
| TW | 200614891 | 5/2005 |

OTHER PUBLICATIONS

Jin-Du Lin, "Application of RCC in HDI/BUM", Printed Circuit Information, Apr. 2002, pp. 8 to 11, 2002 (4), 1994-2008 China Academic Journal Electronic Publishing House, China.

* cited by examiner

*Primary Examiner*—Lan Vinh
(74) *Attorney, Agent, or Firm*—Andrew C. Cheng

(57) ABSTRACT

A method for forming stacked via-holes on a printed circuit board includes the steps of: providing a printed circuit board having a conductive trace formed on a side surface thereof; forming a first copper-clad laminate on the side surface having the conductive trace; forming a number of first copper micro-via in a copper layer of the first copper-clad laminate; forming a second copper-clad laminate on the surface of the copper layer having the first copper micro-via of the first copper-clad laminate; forming a number of second copper micro-via in a copper layer of the second copper-clad laminate by a first laser on the basis of the first copper micro-via, each second copper micro-via being located corresponding to its correspondingly first copper micro-via; and removing corresponding resin layer portions of the first and second copper-clad laminates, using a second laser, to yield the respective stacked via-holes.

20 Claims, 8 Drawing Sheets

METHOD FOR FORMING STACKED VIA-HOLES IN PRINTED CIRCUIT BOARDS

FIELD OF THE INVENTION

The present invention generally relates to methods for manufacturing printed circuit boards and, more particularly, to a method for forming stacked via-holes on high density interconnection (HDI) printed circuit boards.

DESCRIPTION OF RELATED ART

With the development of science and technology, microphones, portable computer and electronic products used in cars etc. require ever greater levels of miniaturization. To meet these requirements, the degree of circuit integration is increasing and circuit patterns are becoming ever more dense; and widths of traces, gaps between traces and diameter of via-holes are becoming ever more fine. To accommodate these developments in the art, HDI printed circuit boards have been developed.

A typical HDI flexible printed circuit board is a multiple-layered laminated sheet including a number of base films and a number of copper films adhesively bonded to one surface of the base films, either directly or via an adhesive layer sandwiched therebetween. Conductive traces are disposed in the copper films. Stacked via-holes pass through at least two layers of laminated sheets, functioning to electrically connect the two conductive traces of the two laminated sheets. Each stacked via-hole is composed of at least a copper micro-via in the copper films and at least a film micro-via in the base films. Generally, a micro-via is a hole less than 150 micrometers in diameter.

A typical method of the related art for forming stacked via-holes incorporates an etching process. The method includes the steps of: firstly, providing a double-sided flexible printed circuit board, and then forming a first resin coated copper (RCC) foil separately on two side surfaces of the double-sided flexible printed circuit board. Secondly, a number of first copper micro-vias in two copper layers of two first resin coated copper foils are formed by using an etching process. Thirdly, a second resin coated copper foil is separately formed on each copper layer of two first resin coated copper foils. Fourthly, a number of second copper micro-vias are formed in each copper layer of two second resin coated copper foils by an etching process. Fifthly, corresponding portions of the resin layer of the first and second resin coated copper foils are removed from the first and second copper micro-via using a $CO_2$ laser, thus obtaining a number of stacked via-holes. Finally, inner walls of the stacked via-holes undergo an electro-plating process, thereby obtaining a number of electrically conductive stacked via-holes. These electrically conductive, stacked via-holes can be used to electrically connect the first resin coated copper foils and the second resin coated copper foils.

The typical method for forming the stacked via-holes described above has the following disadvantages. First of all, the first and second copper micro-vias are formed using the etching process. The etching process generally includes many steps, such as applying a photoresist, exposing, developing, and etching, and discrepancies may inevitably be introduced at each step. Such discrepancies may affect a size and a location of the first and second copper micro-via. Thus, such variances may occur between, e.g., the first copper micro-via and the corresponding second copper micro-via, thereby potentially producing alignment and/or sizing errors in the finished stacked via-holes.

Therefore, it is desirable to provide an improved method for forming stacked via-holes on HDI printed circuit boards that overcomes the above-described problems.

SUMMARY OF THE INVENTION

A method for forming stacked via-holes on a HDI (High Density Interconnection) printed circuit board is provided. The method includes the steps of: providing a printed circuit board having a conductive trace formed on a side surface thereof; forming a first metal-clad laminate on the side surface having the conductive trace; forming a number of first metal micro-vias in a metal layer of the first metal-clad laminate; forming a second metal-clad laminate on the surface of the metal layer of the first copper-clad laminate after having formed the first metal micro-vias in such metal layer thereof; forming a number of second metal micro-via in a metal layer of the second copper-clad laminate using a first laser, each second metal micro-via being located corresponding to a respective first metal micro-via; and removing corresponding resin layer portions of the first and second metal-clad laminates, using a second laser, in order to yield the respective stacked via-holes.

Advantages and novel features will become more apparent from the following detailed description when taken in conjunction with the accompanying drawings.

BRIEF DESCRIPTION OF THE DRAWINGS

Many aspects of the present method can be better understood with reference to the following drawings. The components in the drawings are not necessarily drawn to scale, the emphasis instead being placed upon clearly illustrating the principles of the present method. Moreover, in the drawings, like reference numerals designate corresponding parts throughout the several views.

DETAILED DESCRIPTION OF THE INVENTION

Figure 1:
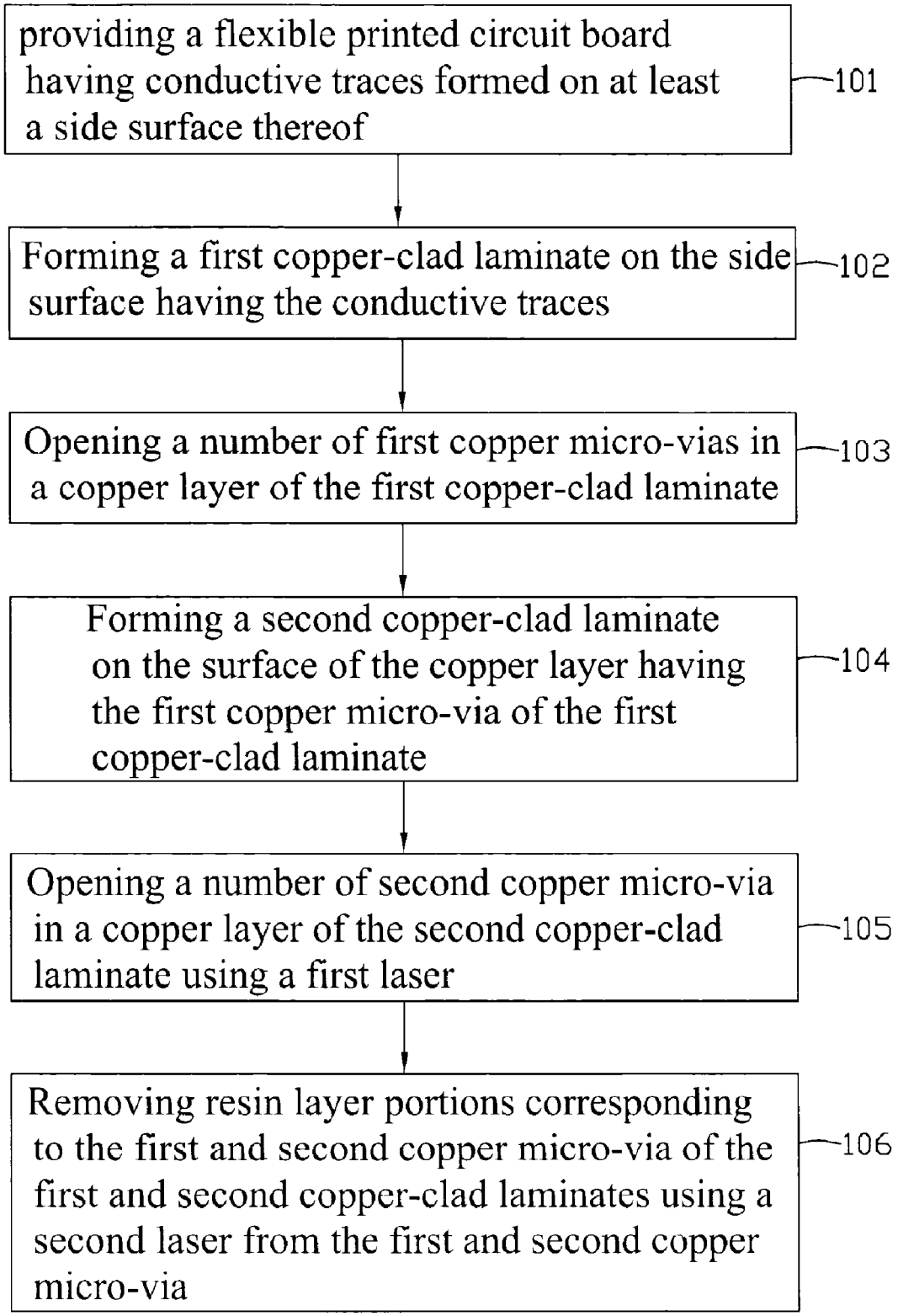
FIG. 1 is a flow chart of a preferred embodiment for forming stacked via-holes in a double-sided printed circuit board.

A method for forming stacked via-holes in a HDI printed circuit boards will be explained with reference to FIG. 1. The method includes the following steps: step 101, providing a printed circuit board having conductive traces formed on at least a side surface thereof; step 102, forming a first copper-clad laminate on the side surface having the conductive traces; step 103, creating a number of first copper micro-vias in a copper layer of the first copper-clad laminate (CCL); step 104, forming a second copper-clad laminate on the surface of the copper layer of the first copper-clad laminate after having formed the first copper micro-vias in such copper layer thereof; step 105, creating a number of second copper micro-vias in a copper layer of the second copper-clad laminate using a first laser; and step 106, removing resin layer portions corresponding to the first and second copper micro-vias of the first and second copper-clad laminates by a second laser from the regions of the first and second copper micro-vias, thus completing the micro-via combinations that are to serve as binary stacked via-holes.

In the aforementioned method, the copper-clad laminate may be single-sided or doubled-sided. The single-sided or double-sided copper-clad laminate may be single-layered, double-layered, or multi-layered. The copper-clad laminate may, advantageously, be a resin coated copper (RCC) foil or a copper prepreg (i.e., pre-impregnated) foil. In addition, the printed circuit board having conductive traces may, usefully, be made of various copper-clad laminates mentioned above. For example, the HDI printed circuit boards are generally composed of multilayer copper-clad laminates by a build-up method (i.e., building up layers one on top of the other).

Figure 2:
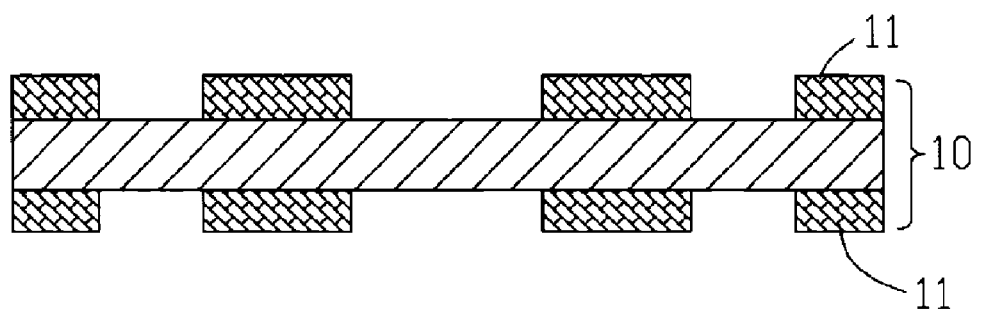
FIGS. 2-8 are schematic views of the double-sided printed circuit board at various stages of production, those stages generally corresponding to the steps of the preferred method set forth in the flow chart of FIG. 1.

In the general step 101, a printed circuit board is provided. The printed circuit board may, for example, be a flexible printed circuit board, or a rigid printed circuit board. The printed circuit board may be a single-sided or a double-sided printed circuit board. The single-sided or double-sided printed circuit board may be a single-layered, a double-layered, or a multilayer printed circuit board. Referring to FIG. 2, a single-layered double-sided flexible printed circuit board 10 is illustrated. Such a double-sided flexible printed circuit board 10 may, for example, consist of a double-sided copper-clad laminate. Each side surface of the double-sided flexible printed circuit board 10 has a conductive trace 11.

The present double-sided flexible printed circuit board 10 can be used as an inner layer to manufacture a HDI flexible printed circuit board by a build-up method and by simultaneously manufacturing stacked via-holes. Such via-holes are configured (i.e., structured and arranged) for electrically connecting the conductive trace on adjacent layers of the manufactured HDI flexible printed circuit board. In the present embodiment, a number of desired stacked via-holes are used to electrically connect three conductive trace layers, so each desired stacked via hole is composed of two micro holes that are stacked one on another. Such a stacked via hole is generally called a binary stacked via hole. Each of the two micro holes composing the binary stacked via hole is defined in a sheet of copper-clad laminate and is composed of a copper micro hole in the copper layer and a film micro hole in the resin layer. In each micro hole, a diameter of the copper micro hole is equal to that of the film micro hole. Regarding the binary stacked via hole, a diameter of the two adjoining micro holes may be equal or different.

Figure 3:
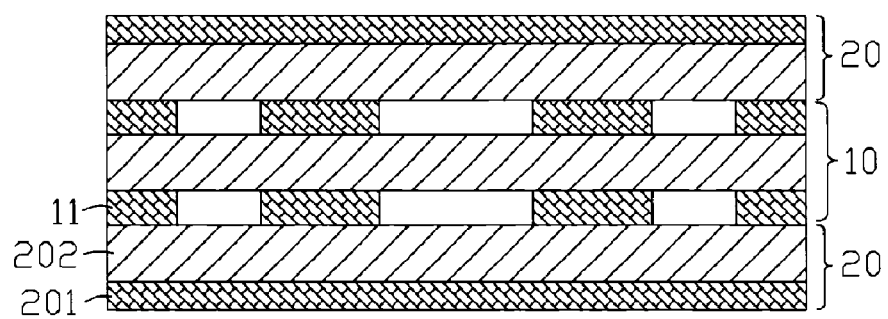

Referring to FIG. 3, which corresponds to the general step 102, two first copper-clad laminates 20 are separately formed on two side surfaces of the double-sided flexible printed circuit board 10. The copper-clad laminates 20 may, advantageously, be pasted or otherwise adhered on the side surfaces of the double-sided flexible printed circuit board 10 by a laminator or applied manually. In the attachment process, the first copper-clad laminates 20 can be wetted with water firstly, thus facilitating an improved initial, temporary bond (due in large part to the hydrogen bonding phenomenon associated with water) with the side surfaces of the double-sided flexible printed circuit board 10, until the paste/adhesive is able to dry and/or cure, as the case may be.

The first copper-clad laminates 20 may, advantageously, be a resin-coated copper or a copper prepreg foil. The copper prepreg foil can be made of a copper foil and a prepreg bonded together, having been stacked up and placed under a large pressure. The prepreg used in making the copper prepreg foil is advantageously constructed from a fibre glass matting, which has been impregnated with epoxy resin. Each first copper-clad laminate 20 includes a first copper layer 201 and a first resin layer 202. Materials for making the first resin layer 202, usefully, may easily absorb infrared rays (IR) and thus can easily be burned and vaporized by an IR laser. Therefore, a number of first film micro-vias 22 can be readily created in the first resin layer 202.

Figure 4:
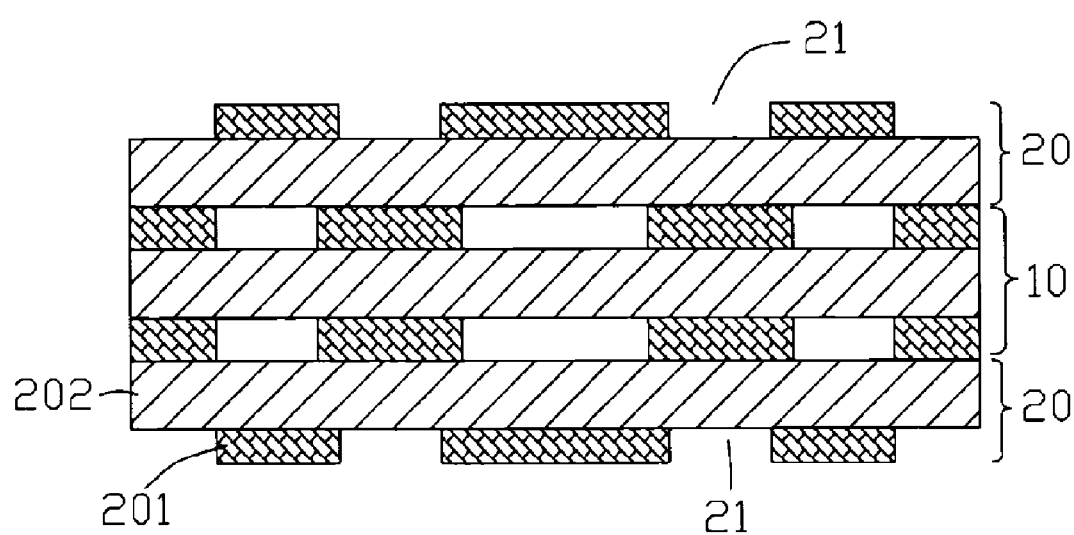

Referring to FIG. 4, which corresponds to the general step 103, a number of first copper micro-vias 21 are created in each first copper layer 201 of the two first copper-clad laminates 20. Each first copper micro-via 21 is located at an appropriate position corresponding to a predetermined connecting position (i.e., conductive path) on the conductive traces 11 of the double-sided flexible printed circuit board 10. The locations of the first copper micro-vias 21 are determined in their manufacturing process. As for the forming of a desired binary stacked via, the present first copper micro-vias 21 are firstly created and are used to provide a reference point for creating the respective binary stacked vias. As for two stacked micro holes used for composing a desired binary stacked via, the first copper micro-via 21 of one micro hole has, in the illustrated embodiment, a smaller hole diameter than the other.

A given first copper micro-via 21 may be defined/formed by an etching process or by a laser. An example of creating the first copper micro-via 21 by the etching process is provided in the following. Firstly, a photoresist is formed onto the copper layer surfaces of two first copper-clad laminates 20. The photoresist may be a positive photoresist or a negative photoresist. In the present embodiment, a positive photoresist is used. Secondly, the positive photoresist is exposed with a photo mask, which has a first desired pattern. The first desired pattern of the photo mask is designed according to the locations and diameters of the desired first copper micro-via 21. Such controlled patterning ensures that each first copper micro-via 21 is located at an appropriate position corresponding to a predetermined connecting position on the conductive traces of the double-sided flexible printed circuit board 10. After exposure, exposed portions of the positive photoresist undergo a chain scission, therefore becoming soluble. However, it is to be understood that any of the various, known etching processes (e.g., electron beam, ion beam, etc.) that facilitate precise hole formation may be used and, thus, be within the scope of the present method.

An alternative method of forming the first copper micro-vias 21 is by a laser process. For example, the copper layer 201 is bombarded, for example, by a Nd:YAG (Neodymium: Yttrium Aluminum Garnet) laser to form a number of first copper micro-vias 21. Before the first copper-clad laminates 20 are formed on the two side surfaces of the double-sided flexible printed circuit board 10, a number of pre-connecting positions corresponding to the first copper micro-vias 21 to be formed are defined on the conductive trace 11. Each pre-connecting position can, usefully, act as a reference point which the Nd:YAG laser can identify. According to a required diameter of a given first copper micro-via 21 to be formed, the Nd:YAG laser can be adjusted according to the pre-connecting positions for bombardment of the copper layer 201, thereby creating a number of required first copper micro-vias 21. It is, of course, understood that other types of lasers could be employed in this and other steps of the process and still be within the scope of the present method.

Thirdly, the positive photoresist is developed with a developing agent to remove the soluble portions of the positive photoresist, and residual portions of the positive photoresist covering parts of the first copper layer 201 form a second desired pattern. The second desired pattern is composed of the covered first copper layer 201 portions and the uncovered first copper layer 201 portions. Each uncovered portion of the first copper layer 201 separately corresponds to a predetermined connecting position on the conductive trace 11. The residual portions of the positive photoresist can protect the covered first copper layer 201 from corrosion when being etched. Finally, the uncovered portions of the first copper layer 201 are etched with an etching solution, and the covered portions of the first copper layer 201 are not etched. Thus, a number of the first copper micro-vias 21 can be formed in this general manner. Each obtained first copper micro-vias 21 corresponds to predetermined positions of the conductive traces 11 of the double-sided flexible printed circuit board 10.

Figure 5:
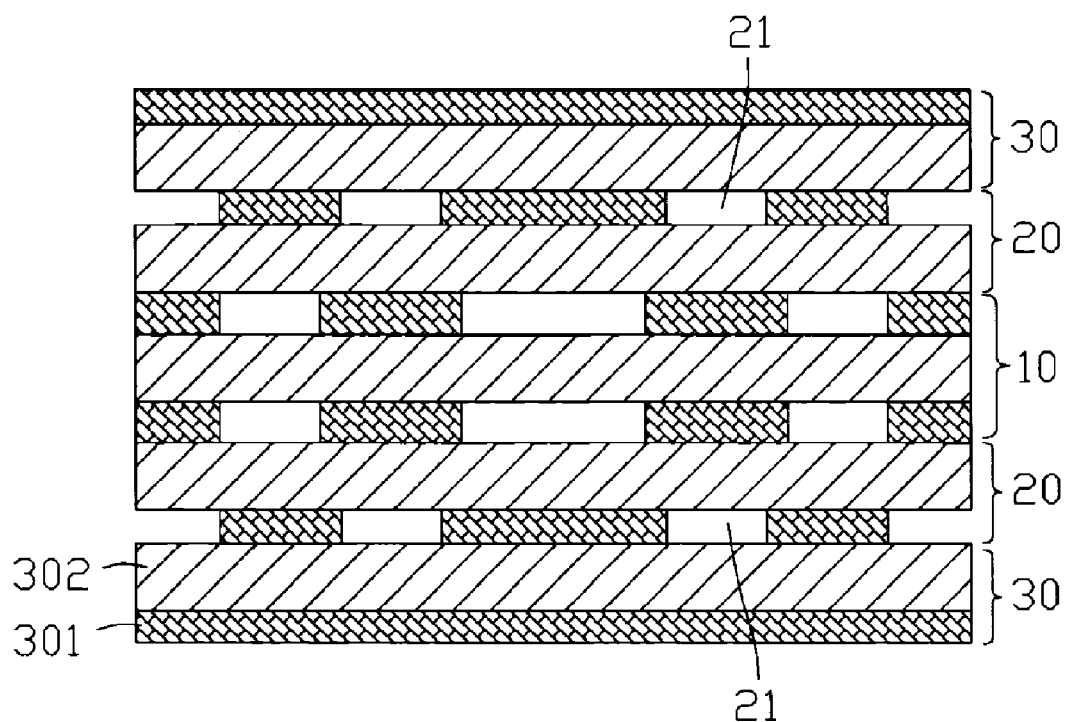

Referring to FIG. 5 and the corresponding step 104, two second copper-clad laminates 30 are separately formed on surfaces of the two first copper layers 201. The second copper-clad laminates 30 may, usefully, be a resin coated copper or a copper prepreg foil. In the present embodiment, the second copper-clad laminates 30 are made of a similar material and have a similar structure as the first copper-clad laminates 20. Each second copper-clad laminate 30 is composed of a second copper layer 301 and a second resin layer 302. The second copper-clad laminates 30 may, advantageously, be adhered onto the first copper layer 201 of the first copper-clad laminates 20 by a laminator or applied manually thereto. In the adhering process, the second copper-clad laminates 30 can be wetted with water first, thus ensuring a firm initial attachment thereof with the respective surfaces of the first copper layer 201 of the first copper-clad laminates 20.

Figure 6:
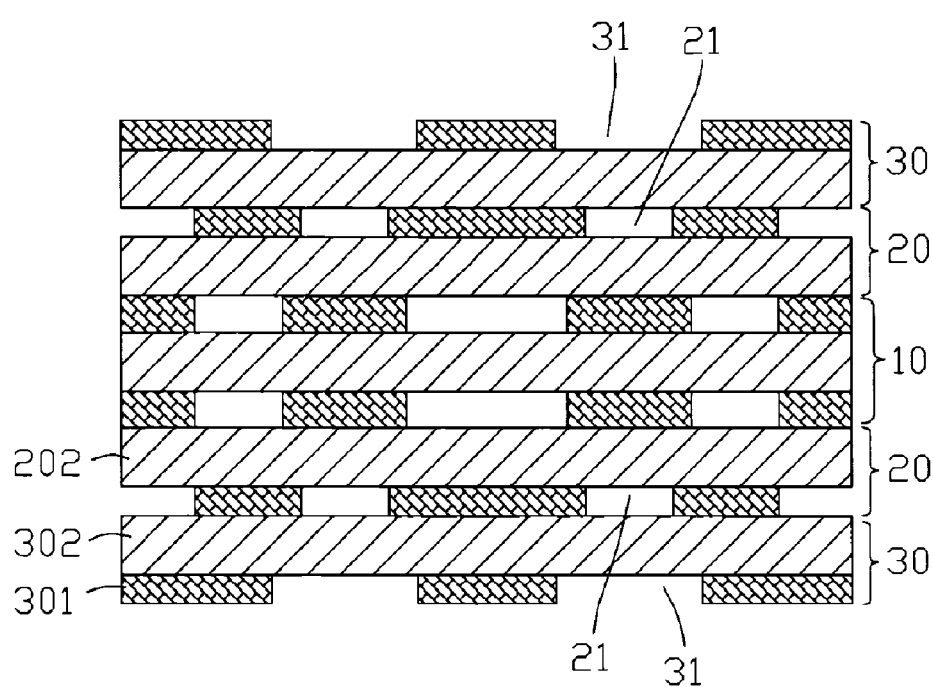

Referring to FIG. 6, in accordance with the general step 105, a number of second copper micro-vias 31 are created in each second copper layer 301 of the two second copper-clad laminates 30. A diameter of the second copper micro-via 31 is greater than or at least equal to that of the corresponding first copper micro-via 21, while each position of the second copper micro-via 31 separately corresponds to the position of its corresponding first copper micro-via 21. For example, the first copper micro-via 21 and the second copper micro-via 31 are circular holes, and each first copper micro-via 21 shares a common center with its corresponding second copper micro-via 31.

The second copper micro-vias 31 may be formed by a first laser. The first laser may, e.g., be an ultraviolet (UV) laser or an IR laser. In the present embodiment, the second copper micro-vias 31 are, beneficially, formed with a UV laser, e.g., a Nd:YAG laser. The Nd:YAG laser can, typically, directly burn irradiated regions of the second copper layer 301 of the second copper-clad laminates 30. In particular, the second copper micro-vias 31 can be created, quite suitably, by a fourth harmonic Nd:YAG laser (i.e., one with a wavelength of about 266 nanometers) or by a third harmonic Nd:YAG laser (i.e., one with a wavelength of about 355 nanometers). Particularly advantageously, the third harmonic of a Nd:YAG laser is utilized to process the copper layer, because it can be easily absorbed by the copper layer and thus quickly vaporize the copper layer. As such, regions of the copper layer irradiated by the third harmonic Nd:YAG laser are evaporated, the regions thus becoming copper micro-vias. Therefore, in the present process the third harmonic of a Nd:YAG laser is preferable when defining the second copper micro-vias 31.

For example, the third harmonic Nd:YAG laser is utilized as the first laser source to create the second copper micro-vias 31. During bombardment of the second copper layer 301 to form the second copper micro-vias 31, the location of each first copper micro-via 21 is used as a reference point for creating the second copper micro-via 31, that is, each first copper micro-via 21 can act as a reference point which the third harmonic Nd:YAG laser can identify. According to a required diameter of the second copper micro-via 31, the third harmonic Nd:YAG laser can be adjusted on the basis of the first copper micro-via 21 to bombard the second copper layer 301, therefore creating a number of required second copper micro-vias 31. It is to be understood that the laser sources used in, e.g., steps 103 and 105, can be the same laser or different lasers. Additionally, where different lasers are employed, the type of laser may be the same for each or may vary, on a laser-by-laser basis. Finally, it is to be understood that one or more lasers may be employed at each such step, depending on such variables as the desired process throughput and the cost of the process apparatus.

Figure 7:
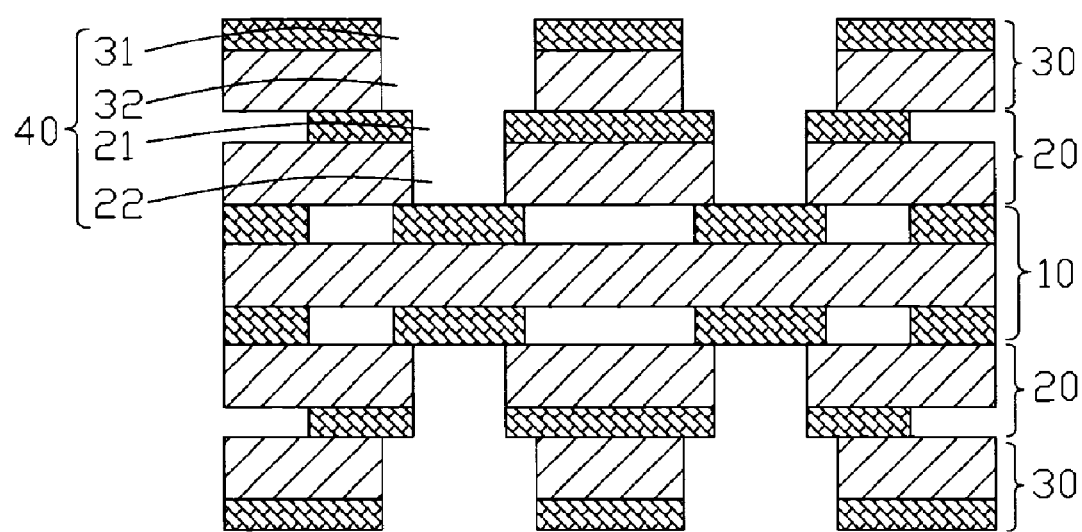

Referring to FIG. 7, in the general step 106, the parts of the resin layers 202, 302 corresponding to the first and second copper micro-vias 21 and 31 are removed by a second laser, thus completing and obtaining a number of first film micro-vias 22 in the first resin layers 202 and a number of second film micro-vias 32 in the second resin layers 302. Each first copper micro-via 21 and its corresponding first film micro-via 22 co-operatively constitute a first micro hole. Each second copper micro via 31 and its corresponding second film micro-via 32 co-operatively constitute a second micro hole. The first micro hole and its corresponding second micro hole, in turn, co-operatively constitute desired binary stacked via-holes 40.

During the laser definition of the first and second film micro-vias 22, 32, parts of the resin layer 202, 302 to be removed can be vaporized via absorption of the laser energy. Each material for making the resin layer 202, 302 generally can absorb a certain wavelength laser, at a certain absorbance level. As such, the second laser may, advantageously, be chosen according to an optimal absorbance wavelength for the resin layer 202, 302 of the first and second copper-clad laminates 20 and 30. For example, the second laser may be an UV laser or an IR laser. In the present step, depending on the absorption performance of the resin layers 202, 302 of the first and second copper-clad laminates 20, an the IR laser, e.g., a $CO_2$ laser, may be advantageously employed.

The parts of the resin layers 202, 302 for forming the first and second film micro-vias 22, 32 can strongly absorb the energy of the $CO_2$ laser. Accordingly, these parts of the resin layers 202, 302 can be easily burned and vaporized using such a laser, thereby forming a number of first film micro-vias 22 in the first resin layers 202 and a number of second film micro-vias 32 in the second resin layers 302. In addition, the copper material is a poor absorber of $CO_2$ laser energy. That is, the conductive traces 11 and the copper layers 201, 301 bombarded by the $CO_2$ laser suffer practically no damage. As such, when the parts of the resin layers 202, 302 for forming the first and second film micro-vias 22, 32 are vaporized, the exposed conductive traces 11 of the double-sided flexible printed circuit board 10 basically can not be damaged by the $CO_2$ laser. Furthermore, because the diameter of each second micro-via 31 is the same or, even more advantageously, larger than that of each first micro-via 21, once the portions of the second resin layer 302 are vaporized to form the second micro-vias 31, the exposed portions of the first copper layer 202 can not be damaged by the $CO_2$ laser.

Figure 8:
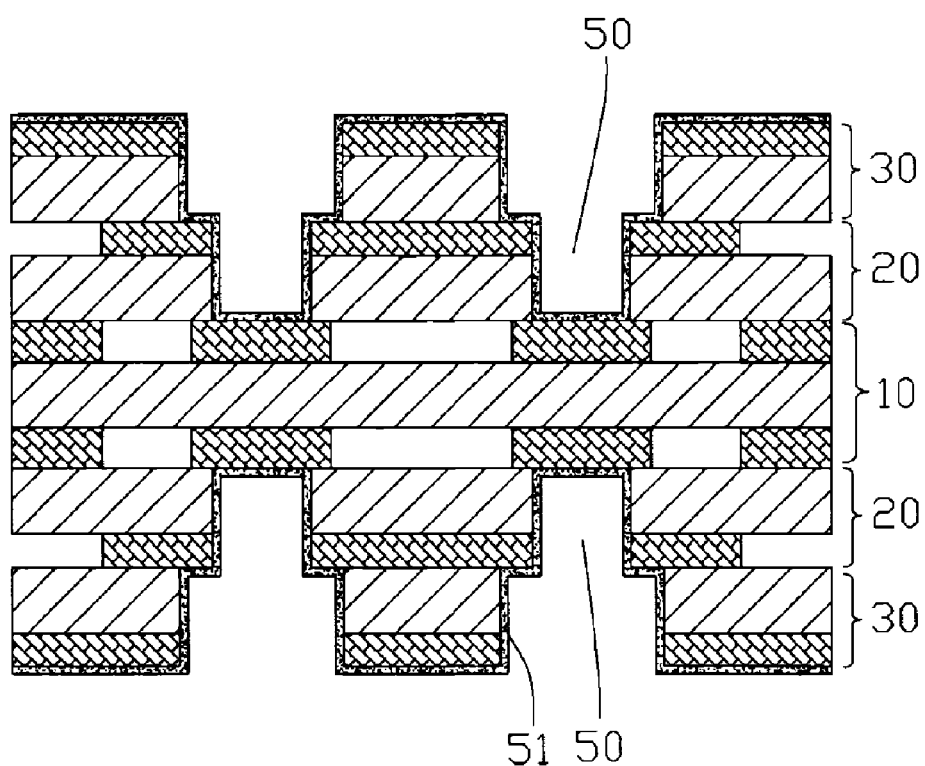

Finally, referring to FIG. 8, a metallization process is performed on the binary stacked via-holes 40. For example, a copper layer 51 is formed on an inner wall of each binary stacked via-holes 40, thus obtaining a number of copper-coated binary stacked via-holes 50. The copper layer 51 may be created, e.g., by an electro-plating method (i.e., a graphite-based direct electro-plating process) or a chemical plating method. For example, the copper layer 51 can be electro-plated on the inner walls of the binary stacked via-holes 40 by the graphite-based direct electro-plating process. Copper is the preferred conductive metal for, e.g., the conductive paths and the vias due to its relatively high conductivity and oxidation resistance, generally low cost, and ease of processing (e.g., deposition, laser machining, etc.). However, while copper is illustrated as the preferred conductive metal, it is to be understood that another highly conductive, oxidation-resistant metal or alloy, such as another noble metal (e.g., Ag, Au), a platinum group metal, or an alloy comprised thereof, could be employed as the conductive material, either in conjunction with copper or as an alternative thereto, and still be within the scope of the present method.

The graphite-based direct electro-plating process is detailed in the following. The inner walls of the binary stacked via-holes 40 are treated with a conditioner (i.e., a slightly alkaline compound containing a cationic polyelectrolyte with multiple positive charges), thus facilitating the carrying of positive charge by inner walls of the binary stacked via-holes 40. A highly conductive graphite powder layer with negative charges is then dispersed on each positively charged inner wall surface of the binary stacked via-holes 40, thereby making it possible to electro-plate the desired copper layer 51. Then, the double-sided flexible printed circuit board 10 including the first and second copper-clad laminates 20 and 30 is disposed in an electro-plating solution to perform the electro-plating process. As a result, the desired copper layer 51 is created on the positively charged inner wall surfaces of the binary stacked via-holes 40, thus obtaining the desired copper binary stacked via-holes 50.

As for high-level stacked via-holes used to electrically connect multilayer conductive traces of the flexible printed circuit boards, each high-level stacked via hole can be composed of a number of stacked micro holes, e.g., five stacked micro holes composed of five copper holes and five film holes, or more than five stacked micro holes. Due to such stacking, a ratio of a depth to a diameter of such stacked via-holes is relatively large, e.g., such ratio is larger than 10:1. When the copper micro-vias are created in the aforementioned way, the graphite powder may jam the stacked via-holes because of the large ratio of depth to diameter. Moreover, it can be very difficult to directly electro-plate the copper layer 51 on the inner walls of those stacked via-holes if such jamming does occur. Therefore, the chemical plating process is generally more suitable for forming the copper layer 51 on the inner walls of high-level stacked via-holes. In the chemical plating process, a flexible printed circuit board having a number of stacked via-holes is disposed in a copper plating solution, which has a number of copper ions therein. In an appropriate chemical plating condition, the copper ions of the copper plating solution can be reduced and thus deposited on the inner walls of the stacked via-holes, thereby obtaining a number of copper-plated stacked via-holes.

In the present example for opening binary stacked via-holes on the HDI flexible printed circuit boards, the second copper micro-vias 31 are formed directly based on the position of corresponding first copper micro-vias 21 and defined by the UV laser process in which only once reference-point-taking process is needed. As such, a relatively exact vector can be attained between the first copper micro-via 21 and the second copper micro-via 31. The obtained binary stacked via-holes 40 achieve a high concentricity (i.e., between the micro-via holes of which each is composed) and, as such, electrical signals between the adjacent conductive traces (e.g., between the conductive trace 11 and the first copper layer 201) can be exactly and efficiently transferred.

In addition, as the resin layers 202, 302 of the first and second copper-clad laminates 20 and 30 are removed by the laser process, compared with the etching process of the related art, the manufacturing process is simplified and time is saved. Furthermore, compared with the etching process, the present laser process can avoid the HDI flexible printed circuit boards undergoing expansion or shrinkage deformation. Thus, the obtained binary stacked via-holes 40 should also avoid deformation.

It is believed that the present embodiment and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A method for forming stacked via-holes, said method comprising:
    providing a printed circuit board having a conductive trace formed on a side surface thereof;
    forming a first metal-clad laminate on the side surface having the conductive trace;
    forming a plurality of first metal micro-vias in a metal layer of the first metal-clad laminate;
    forming a second metal-clad laminate on the surface of the metal layer of the first metal-clad laminate after having formed the first metal micro-vias in such metal layer thereof;
    forming a plurality of second metal micro-vias in a metal layer of the second metal-clad laminate using a first laser, each second metal micro-via being located corresponding to a location of a respective first metal micro-via, a diameter of the second metal micro-via being larger than that of the first metal micro-via; and
    removing corresponding resin layer portions of the first and second metal-clad laminates using a second laser, in order to yield stacked via-holes.

2. The method as claimed in claim 1, wherein the provided printed circuit board is a high density interconnection flexible printed circuit board.

3. The method as claimed in claim 1, wherein the provided printed circuit board is a high density interconnection rigid printed circuit board.

4. The method as claimed in claim 1, wherein the first metal micro-vies are formed with an etching process.

5. The method as claimed in claim 1, wherein the resin layer portions of the first and second metal-clad laminates are removed using a laser method.

6. The method as claimed in claim 1, wherein, in the step for forming the second metal micro-vias, a given first metal micro-via acts as a reference point that the first laser can identify.

7. The method as claimed in claim 1, further comprising a step of metallizing an inside surface of each stacked via-hole.

8. The method as claimed in claim 1, wherein the stacked via-holes display a high concentricity between the respective micro-via holes of which each is composed.

9. The method as claimed in claim 1, wherein the resin layer portions wholly exposed to the first and second metal micro-vias of the first and second metal-clad laminates are removed using the second laser.

10. The method as claimed in claim 1, wherein the first metal-clad laminate is wetted with water before forming on the side surface of the printed circuit board.

11. The method as claimed in claim 1, wherein the first metal micro-vias are formed with a laser process.

12. The method as claimed in claim 11, wherein the second metal micro-vias are fanned by a Nd:YAG (Neodymium: Yttrium-Aluminum-Garnet) laser.

13. The method as claimed in claim 1, wherein the metal layer of each of the first metal-clad laminate and the second metal-clad laminate is comprised of a highly conductive, oxidation resistant metal.

14. The method as claimed in claim 13, wherein the highly conductive, oxidation resistant metal is comprised of copper.

15. The method as claimed in claim 1, wherein the first laser for forming the second metal micro-vias is an ultraviolet laser or an infrared laser.

16. The method as claimed in claim 15, wherein the second metal micro-vias are formed by a fourth harmonic Nd:YAG laser.

17. The method as claimed in claim 15, wherein the second metal micro-vias are formed by a third harmonic Nd:YAG laser.

18. The method as claimed in claim 17, wherein the resin layer portions of the first and second metal-clad laminates are removed using a carbon dioxide laser.

19. A method for forming binary stacked via-holes, each binary stacked via hole being composed of a first micro hole and a second micro hole stacked one on another, the first micro hole being composed of a first metal micro-via and a first film micro-via, the second micro hole being composed of a second metal micro-via and a second film micro-via, said method comprising:

provoding a printed circuit board having a conductive trace formed on a side surface thereof;

forming a first metal-clad laminate comprising a first metal layer and a first resin layer on the side surface having the conductive trace;

forming a plurality of first metal micro-vias in the first metal layer of the first metal-clad laminate;

forming a second metal-clad laminate comprising a second metal layer and a second resin layer on the surface of the first metal layer of the first metal-clad laminate after having formed the first metal micro-vias in the first metal layer;

forming a plurality of second metal micro-vias in the second metal layer of the second metal-clad laminate by a first laser, each second metal micro-via being located corresponding to a respective first metal micro-via, a diameter of the second metal micro-via being larger than or equal to that of the first metal micro-via; and removing parts of the second resin layer corresponding to the second metal micro-via and parts of the first resin layer corresponding to the first metal micro-via by a second laser to obtain a plurality of first film micro-vias in the first resin layer and a plurality of second film micro-vias in the second resin layer, thereby yielding a plurality of binary stacked via-holes.

20. The method as claimed in claim 19, wherein the parts of the second resin layer wholly exposed to the second metal micro-vies and the parts of the first resin layer wholly exposed to the first metal micro-vias are removed by the second laser to obtain the first film micro-vies in the first resin layer and the second film micro-vias in the second resin layer, respectively.

* * * * *